(12) United States Patent
Inoh

(10) Patent No.: US 6,855,969 B2
(45) Date of Patent: Feb. 15, 2005

(54) SEMICONDUCTOR DEVICE HAVING A PLURALITY OF GATE ELECTRODES AND MANUFACTURING METHOD THEREOF

(75) Inventor: Kazumi Inoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 10/155,998

(22) Filed: May 29, 2002

(65) Prior Publication Data

US 2004/0222471 A1 Nov. 11, 2004

(30) Foreign Application Priority Data

Apr. 18, 2002 (JP) ........................................ 2002-116388

(51) Int. Cl.$^7$ ............................................. H01L 27/148
(52) U.S. Cl. ........................ 257/250; 257/270; 257/365
(58) Field of Search ................................. 257/250, 270, 257/278, 365, 316, 319, 331, 332, 346, 366

(56) References Cited

U.S. PATENT DOCUMENTS 6,580,132 B1 * 6/2003 Chan et al. .................. 257/365

FOREIGN PATENT DOCUMENTS

| JP | 02162740 A * | 6/1990 | ......... H01L/21/336 |
|---|---|---|---|
| JP | 4-307972 | 10/1992 | |
| JP | 5-308050 | 11/1993 | |
| JP | 6-21456 | 1/1994 | |
| JP | 7-335893 | 12/1995 | |
| JP | 10-326884 | 12/1998 | |
| JP | 2000-277403 | 10/2000 | |
| JP | 2000-307117 | 11/2000 | |

* cited by examiner

*Primary Examiner*—Long Pham
*Assistant Examiner*—Ginette Peralta
(74) *Attorney, Agent, or Firm*—Oblon, Spivak, McClelland, Maier & Neustadt, P.C.

(57) ABSTRACT

A semiconductor device includes first and second gate electrode, first and second gate insulating film, semiconductor layer, source and drain regions, and source and drain electrodes. The first gate electrode is formed in the insulating film. The first gate insulating film is formed on the first gate electrode. The semiconductor layer is formed on the insulating film. The source and drain regions are formed in the semiconductor layer. The source and drain electrodes are respectively formed on the source and drain regions. The positions of side wall surfaces of the source and drain electrodes which face each other are substantially aligned with the positions of both side wall surfaces of the first gate electrode in a direction perpendicular to the surface of the insulating film. The second gate insulating film is formed on the semiconductor layer. The second gate electrode is formed on the second gate insulating film.

7 Claims, 7 Drawing Sheets

SEMICONDUCTOR DEVICE HAVING A PLURALITY OF GATE ELECTRODES AND MANUFACTURING METHOD THEREOF

CROSS-REFERENCE TO RELATED APPLICATIONS

This application is based upon and claims the benefit of priority from the prior Japanese Patent Application No. 2002-116388, filed Apr. 18, 2002, the entire contents of which are incorporated herein by reference.

BACKGROUND OF THE INVENTION

1. Field of the Invention

This invention relates to a semiconductor device and a manufacturing method thereof and more particularly to a double-gate MOS transistor having two gate electrodes.

2. Description of the Related Art

Conventionally, a double-gate MOS transistor having two gate electrodes is known. The double-gate MOS transistor has a feature that the short channel effect can be suppressed in comparison with a MOS transistor having a single gate electrode. Therefore, it is expected to realize an extremely fine MOS transistor having a channel length shorter than 25 nm by using the double-gate structure.

A fabricating method of the double-gate MOS transistor is explained with reference to FIG. 1A to FIG. 1F. FIG. 1A to FIG. 1F are cross-sectional views sequentially showing the fabricating steps of a double-gate MOS transistor.

First, as shown in FIG. 1A, an element isolation region 110 is formed on a silicon substrate 100 by use of a LOCOS (LOCal Oxidation of Silicon) method, for example. Then, a back-gate insulating film 120 and back-gate electrode 130 are sequentially formed on the surface of the silicon substrate 100. Next, as shown in FIG. 1B, an insulating film 140 is formed on the surface of the silicon substrate 100 by the CVD (Chemical Vapor Deposition) method. After this, as shown in FIG. 1C, the insulating film 140 is polished and made flat by the CMP (Chemical Mechanical Polishing) method. Then, a silicon substrate 150 is adhered or bonded onto the insulating film 140 to obtain the structure shown in FIG. 1D. Further, as shown in FIG. 1E, the silicon substrate 100 is polished and made thin by the CMP method or the like so as to form a silicon active layer 160. After this, a front-gate insulating film 170 and front-gate electrode 180 are formed on the silicon active layer 160. Next, side wall insulating films 190, 190 are formed on the side surfaces of the front-gate electrode 180 and source and drain regions 200, 200 are formed in the silicon active layer 160 to complete a double-gate MOS transistor as shown in FIG. 1F.

According to the double-gate MOS transistor having the structure shown in FIG. 1F, the gate delay time can be significantly reduced. As a result, high-speed operation and low power consumption in an LSI can be attained.

However, with the conventional fabricating method of the double-gate MOS transistor, the film thickness of the silicon active layer 160 is determined by the polishing step of the silicon substrate 100 using the CMP method. In this case, if the polishing process is performed by use of the CMP method, high controllability of the film thickness of the silicon active layer 160 cannot be attained. Further, the film may, in some cases, be non-uniform in thickness over its entire surface. As a result, it becomes difficult in some cases to fabricate a MOS transistor having characteristics as designed.

BRIEF SUMMARY OF THE INVENTION

A semiconductor device according to an aspect of the present invention comprises:

a first gate electrode formed in a surface region of an insulating film;

a first gate insulating film formed on the first gate electrode;

a semiconductor layer formed on the first gate insulating film;

source and drain regions separately formed at least in a surface region of the semiconductor layer;

source and drain electrodes respectively formed on the source and drain regions while positions of side wall surfaces thereof which face each other are substantially aligned with positions of both side wall surfaces of the first gate electrode in a direction perpendicular to the surface of the insulating film;

a second gate insulating film formed on a portion of the semiconductor layer which lies between the source and drain electrodes; and a second gate electrode formed on the second gate insulating film and electrically isolated from the source and drain electrodes, the second gate electrode being formed in self-alignment with the first gate electrode, and the source and drain electrodes having a same thickness as the second gate electrode.

A method for fabricating a semiconductor device according to an aspect of the present invention comprises:

forming a first film on a first semiconductor substrate;

forming a first semiconductor layer on the first film;

forming a first gate electrode on a main surface of the first semiconductor layer with a first gate insulating film disposed therebetween;

forming an insulating film on the main surface of the first semiconductor layer to cover the first gate electrode;

laminating a second semiconductor substrate onto the insulating film; separating the first film into a second film in contact with the first semiconductor substrate and a third film in contact with the first semiconductor layer, removing the first semiconductor substrate and second film;

removing the third film; and forming a second gate electrode on a rear surface of the first semiconductor layer with a second gate insulating film disposed therebetween.

DETAILED DESCRIPTION OF THE INVENTION

Figure 1A:
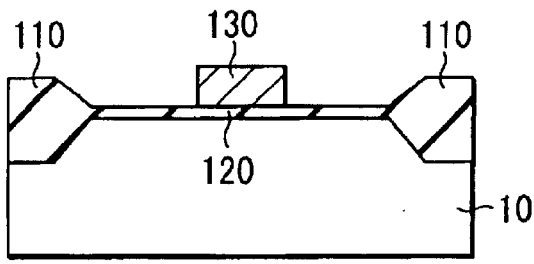
FIG. 1A to FIG. 1F are cross-sectional views sequentially showing the manufacturing steps of a conventional semiconductor device.
Figure 1B:
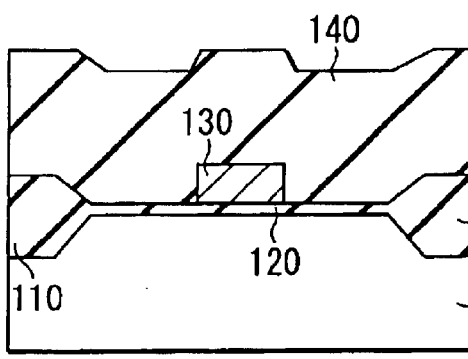
Figure 1C:
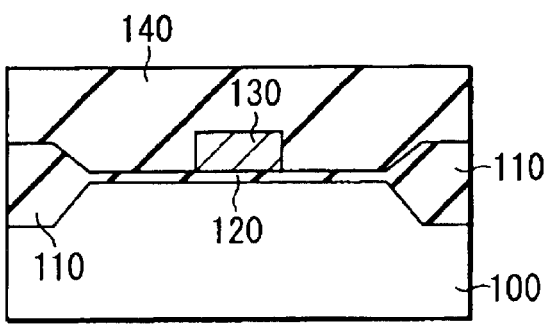
Figure 1D:
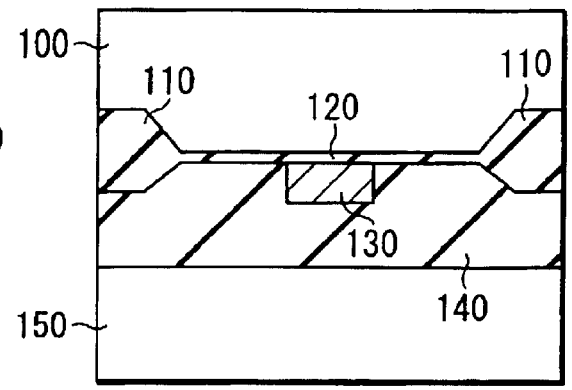
Figure 1E:
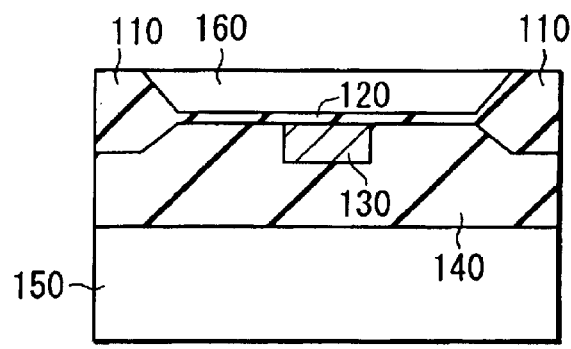
Figure 1F:
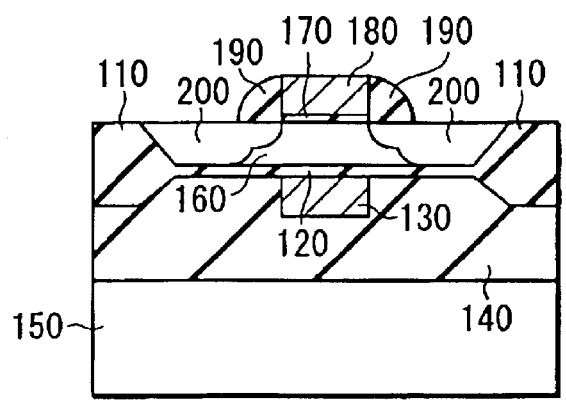
Figure 2:
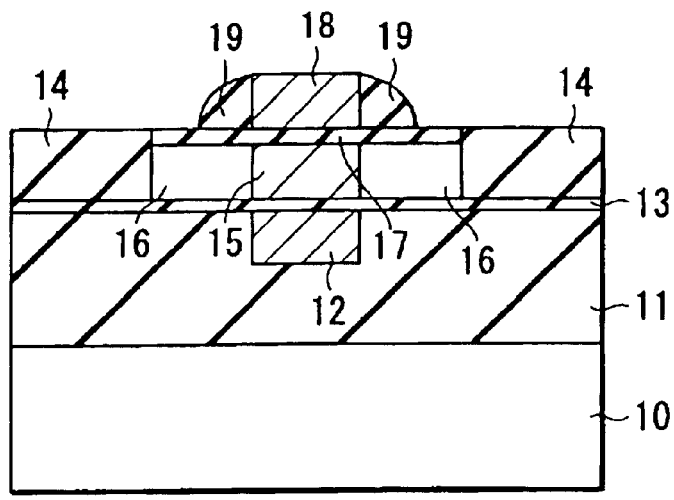
FIG. 2 is a cross-sectional view of a semiconductor device according to a first embodiment of the present invention.

A semiconductor device according to a first embodiment of the present invention is explained with reference to FIG. 2. FIG. 2 is a cross-sectional view of a double-gate MOS transistor.

As shown in FIG. 2, an insulating film 11 is formed on a silicon substrate 10 and a back-gate electrode 12 is formed in the surface region of the insulating film 11. A back-gate insulating film 13 is formed on the insulating film 11 and back-gate electrode 12 and a silicon active layer 15 whose peripheral portion is surrounded by an element isolation region 14 is formed on the back-gate insulating film 13. In the silicon active layer 15, source and drain regions 16, 16 which are separated from each other are formed. The source and drain regions 16, 16 are formed to extend from the upper surface of the silicon active layer 15 and reach the bottom surface thereof. On the silicon active layer 15, a front-gate insulating film 17 is formed. Further, a front-gate electrode 18 is formed on a portion of the silicon active layer 15 which lies between the source and drain regions 16, 16 with the front-gate insulating film 17 disposed therebetween. In addition, side wall insulating films 19, 19 are formed on the side surfaces of the front-gate electrode 18.

In the double-gate MOS transistor with the above structure, the back-gate electrode 12 and front-gate electrode 18 are set at the same potential. Then, expansion of a depletion layer caused by the junction between the drain region 16 and the silicon active layer 15 is suppressed by controlling the electric field distribution of the silicon active layer 15 by use of the two gate electrodes 12, 18. Thus, in the double-gate MOS transistor, the short channel effect can be more effectively suppressed in comparison with the case of a MOS transistor having a single gate electrode. Of course, the potentials of the back-gate electrode 12 and front-gate electrode 18 may be independently controlled in some cases according to circumstances.

Next, a fabricating method of the double-gate MOS transistor with the above structure is explained with reference to FIG. 3A to FIG. 3I. FIG. 3A to FIG. 3I are cross-sectional views sequentially showing fabricating steps of the double-gate MOS transistor shown in FIG. 2.

Figure 3A:
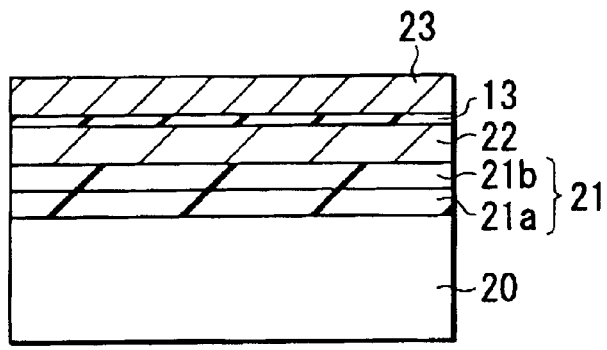
FIG. 3A to FIG. 3I are cross-sectional views sequentially showing the manufacturing steps of a semiconductor device according to the first embodiment of the present invention.

As shown in FIG. 3A, a first film 21 is formed on a silicon substrate 20. The first film 21 is, for example, a porous silicon layer. More particularly, it is a porous single-crystal silicon layer. The porous silicon layer 21 has been formed by means of anodization. The term "porous silicon layer" used in the present specification means a layer that has pores with a diameter of few nm at the density of about $10^{11}/cm^2$.

A method of forming the porous silicon layer by anodization will be described. First, a single-crystal silicon layer is formed. The layer is immersed in a bath of a mixture solution of platinum or the like. A current is made to flow between the silicon layer and the electrode, using the layer as the anode and the electrode as the cathode. The pores are thereby made in the surface of the single-crystal silicon layer.

It is preferred that the porous silicon layer 21 should comprises a second layer and a third layer, or two porous silicon layers 21a and 21b. The lower porous silicon layer 21a has larger pores than the upper porous silicon layer 21b, or the other way around. The diameter of the pores in silicon layer 21 depends on the magnitude of the current supplied between the layer 21 (anode) and the electrode (cathode), on the concentration of the mixture solution, or the specific resistance of silicon.

Then, a single-crystal silicon layer 22 is formed on the porous silicon layer 21 by means of epitaxial growth such as CVD. A back-gate insulating film 13 is formed on the single-crystal silicon layer 22, and a polycrystalline silicon layer 23 is formed on the back-gate insulating film 13. The single-crystal silicon layer 22 will serve as silicon active layer 15 of a MOS transistor in the structure of FIG. 2.

Figure 3B:
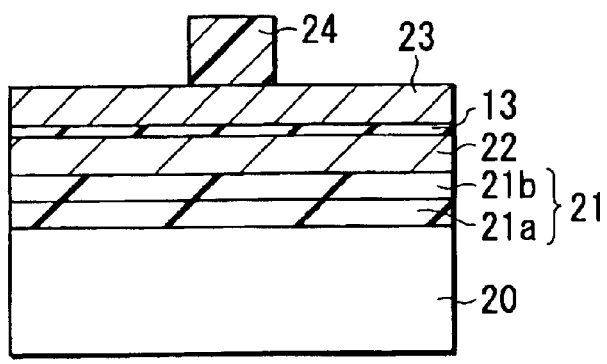

Next, as shown in FIG. 3B, a resist 24 is coated on the polysilicon layer 23 and patterned into a formation pattern of the back-gate electrode by use of the photolithography technology.

Figure 3C:
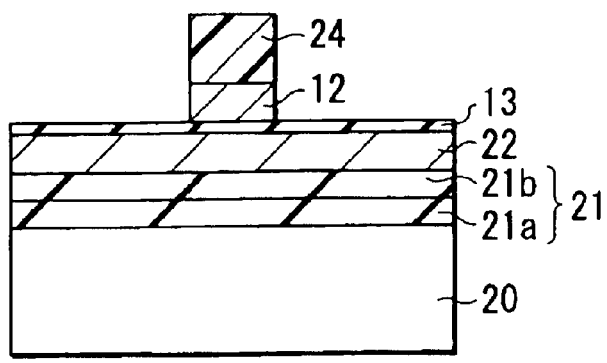

Then, as shown in FIG. 3C, the polysilicon layer 23 is patterned with the resist 24 used as a mask. The patterned polysilicon layer 23 is used as the back-gate electrode 12. After this, the resist 24 is ashed by ashing and removed.

Figure 3D:
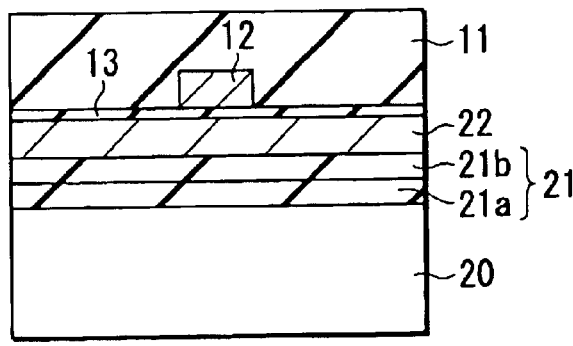

Next, as shown in FIG. 3D, an insulating film 11 is formed on the single-crystal silicon layer 22 to cover the back-gate electrode 12. The insulating film 11 is a silicon oxide film formed by an HDP (High Density Plasma)-CVD method, for example. After this, the surface of the insulating film 11 is polished and made flat by the CMP method.

Figure 3G:
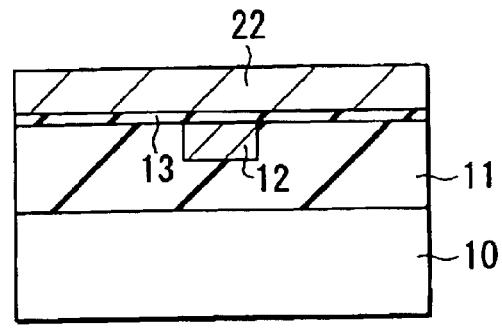
Figure 3E:
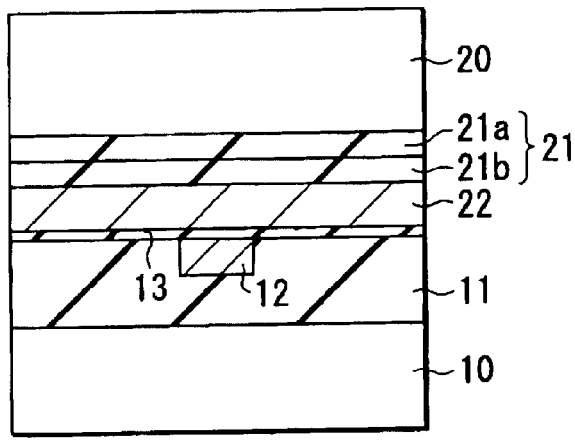

Next, another silicon substrate 10 is prepared and the surface of the silicon substrate 10 is brought into contact with the surface of the insulating film 11 as shown in FIG. 3E. Then, they are bonded or combined by van der Waals' forces. Further, covalent bonding between the insulating film 11 and the silicon substrate 10 is caused by performing heat treatment to strengthen the bonding between them.

Figure 3H:
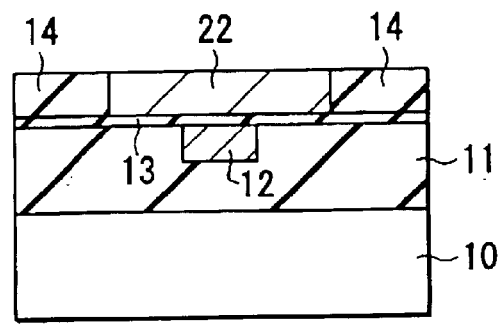
Figure 3F:
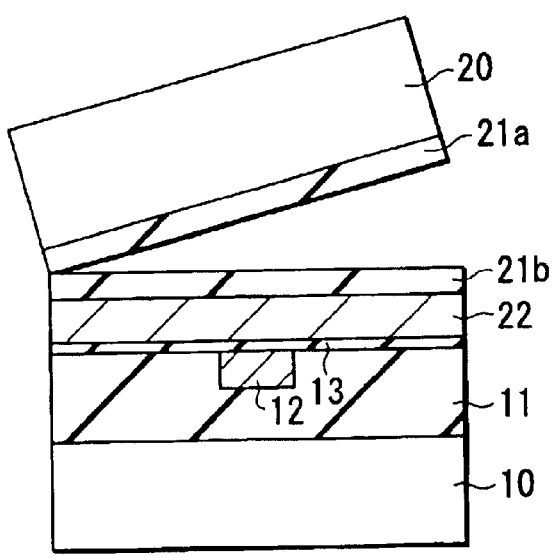

Next, as shown in FIG. 3F, the porous silicon layers 21a, 21b are separated from each other. As a result, the porous silicon layer 21a and silicon substrate 20 are removed. The binding strength between the porous silicon layers 21a, 21b is relatively weak because of the porous property and they can be easily separated from each other. For example, the porous silicon layers 21a, 21b can be separated by pouring an etching solution onto the junction interface between the porous silicon layers 21a, 21b or applying physical force thereto.

Then, as shown in FIG. 3G, the porous silicon layer 21b on the single-crystal silicon layer 22 is removed by etching.

Next, as shown in FIG. 3H, for example, an element isolation region 14 is formed in the single-crystal silicon layer 22 by use of the STI (Shallow Trench Isolation) technique or the like. Of course, it is possible to form the element isolation region 14 by the LOCOS method, but it is preferable to form the same by use of the STI technique from the viewpoint of miniaturization.

Figure 3I:
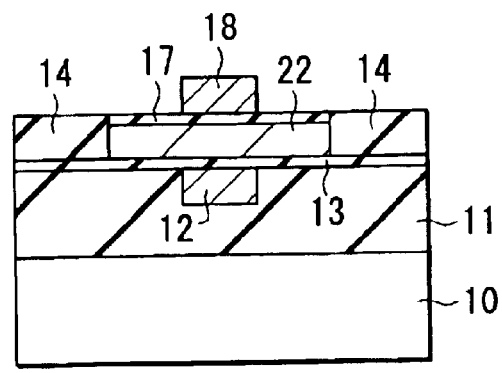

After this, as shown in FIG. 3I, a front-gate insulating film 17 is formed on the rear surface of the single-crystal silicon layer 22, that is, on the surface opposite to the surface on which the back-gate insulating film 13 is formed by a known method. Further, a front-gate electrode 18 is formed on the front-gate insulating film 17 by a known method.

Then, side wall insulating films 19 are formed on the side walls of the front-gate electrode 18. Next, source and drain regions 16, 16 are formed in the silicon active layer 15 by ion implantation so as to complete the double-gate MOS transistor shown in FIG. 2.

According to the above manufacturing method of the semiconductor device, (1) the film thickness of the silicon active layer 15 can be controlled with high precision. This is because the silicon active layer 15 is the single-crystal silicon layer 22 formed by the epitaxial growth method. If the epitaxial method is used, it becomes possible to attain crystal growth while controlling the film thickness thereof with high precision. Further, the silicon active layer 15 may be uniform in thickness over its entire surface. Therefore, double-gate MOS transistors having characteristics as designed can be formed and a variation in the element characteristic can be suppressed.

Further, in a MOS transistor using an SOI (Silicon On Insulator) structure, it is known that occurrence of the short channel effect can be more effectively prevented as the silicon active layer 15 is made thinner. Particularly, it is preferable that the film thickness thereof is set to one-fourth of the gate length or less. According to the manufacturing method of the present embodiment, it is easy to make the silicon active layer 15 thin by using the epitaxial growth method. As a result, the short channel effect in the double-gate MOS transistor can be more effectively suppressed.

Figure 4A:
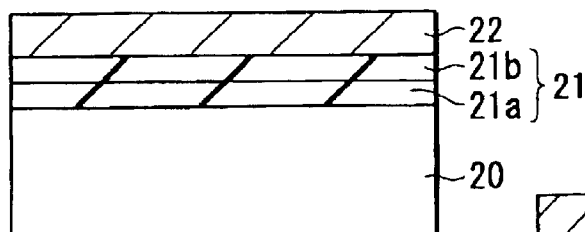
FIG. 4A to FIG. 4C are cross-sectional views sequentially showing the manufacturing steps of a semiconductor device according to a modification of the first embodiment of the present invention.
Figure 4C:
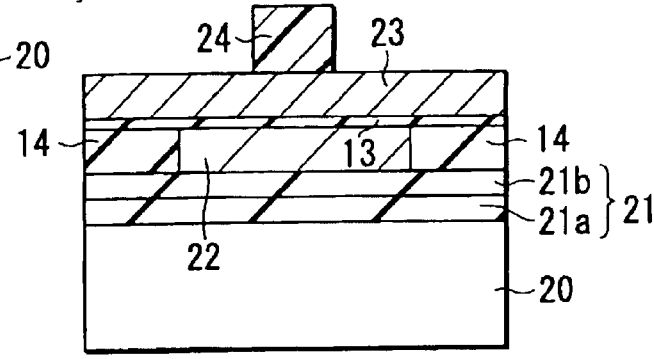
Figure 4B:
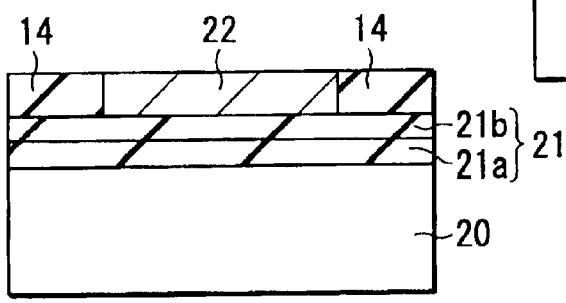

The order of the manufacturing steps in the first embodiment is not limited to the above case and can be changed as far as possible. For example, the element isolation region 14 may be formed in the step shown in FIG. 3A. A manufacturing method of this case is explained with reference to FIG. 4A to FIG. 4C. FIG. 4A to FIG. 4C are cross-sectional views sequentially showing a part of the fabricating steps of a double-gate MOS transistor according to a modification of the first embodiment.

First, as shown in FIG. 4A, a porous silicon layer 21 and single-crystal silicon layer 22 are sequentially formed on a silicon substrate 20. As is explained with reference to FIG. 3A, the porous silicon layer 21 includes two porous silicon layers 21a, 21b having pores of different diameters.

Next, as shown in FIG. 4B, an element isolation region 14 is formed in the single-crystal silicon layer 22 by use of the STI technique, for example. After this, as shown in FIG. 4C, a back-gate insulating film 13 and polysilicon layer 23 are sequentially formed on the single-crystal silicon layer 22 and a resist 24 which is patterned into a pattern of the back-gate electrode is formed. Then, the same steps as those following the step shown in FIG. 3C in the first embodiment are performed so as to complete the double-gate MOS transistor shown in FIG. 2.

Figure 5:
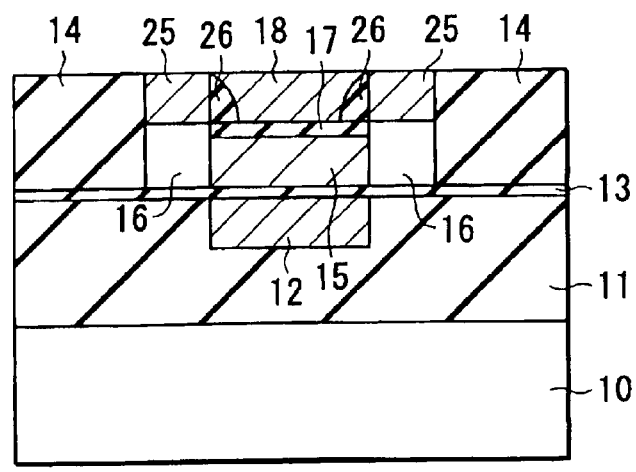
FIG. 5 is a cross-sectional view showing a semiconductor device according to a second embodiment of the present invention.

Next, a semiconductor device according to a second embodiment of the present invention is explained with reference to FIG. 5. FIG. 5 is a cross-sectional view of a double-gate MOS transistor.

As shown in FIG. 5, an insulating film 11 is formed on a silicon substrate 10 and a back-gate electrode 12 is formed in the surface region of the insulating film 11. A back-gate insulating film 13 is formed on the insulating film 11 and back-gate electrode 12. A silicon active layer 15 whose peripheral portion is surrounded by an element isolation region 14 is formed on the back-gate insulating film 13. In the silicon active layer 15, source and drain regions 16, 16 are separately formed. The source and drain regions 16, 16 are formed to extend from the upper surface of the silicon active layer 15 and reach the bottom surface thereof. Source and drain drawing electrodes 25, 25 are respectively formed on the source and drain regions 16, 16 and side wall insulating films 26, 26 are formed on the side surfaces of the source and drain drawing electrodes 25, which face each other. Further, a front-gate electrode 18 is formed on a portion of the silicon active layer 15 which lies between the opposing side wall insulating films 26, 26 with a front-gate insulating film 17 disposed therebetween. In this case, the front-gate electrode 18 and the source and drain drawing electrodes 25, 25 have substantially the same film thickness and the upper surfaces thereof lie on substantially the same plane. Further, the opposing side surfaces of the source and drain drawing electrodes 25, 25 and both side surfaces of the back-gate electrode 12 respectively lie on substantially the same planes. In other words, the front-gate electrode 18 and the back-gate electrode 12 are substantially completely superposed on each other in a direction perpendicular to the silicon substrate 10.

Next, a fabricating method of the double-gate MOS transistor with the above structure is explained with reference to FIG. 6A to FIG. 6I. FIG. 6A to FIG. 6I are cross-sectional views sequentially showing the fabricating steps of the double-gate MOS transistor shown in FIG. 5.

Figure 6A:
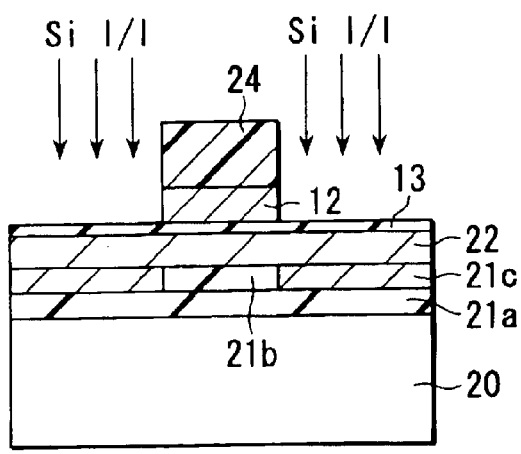
FIG. 6A to FIG. 6I are cross-sectional views sequentially showing the manufacturing steps of a semiconductor device according to the second embodiment of the present invention.

First, the structure shown in FIG. 3C is formed by the fabricating steps explained in the first embodiment. Next, as shown in FIG. 6A, for example, silicon atoms are ion-implanted into the porous silicon layer 21b with the back-gate electrode 12 and resist 24 used as a mask. At this time, the ion-implantation process is performed in a direction perpendicular to the silicon substrate 20. As a result, the porous silicon layer 21b having the silicon atoms ion-implanted therein is modified into an amorphous silicon layer 21c. Then, the remaining porous silicon layer 21b which is not subjected to the ion-implantation process is substantially completely superposed on the back-gate electrode 12 in a direction perpendicular to the silicon substrate 20. After this, the resist 24 is ashed by ashing and removed.

Figure 6B:
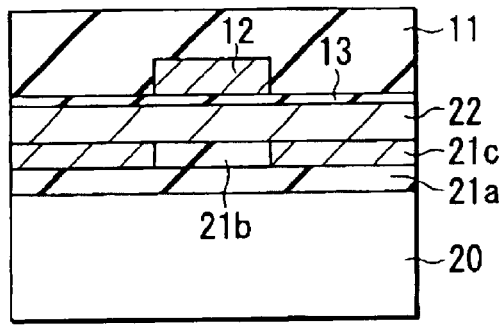

Next, as shown in FIG. 6B, an insulating film 11 is formed on a single-crystal silicon layer 22 to cover the back-gate electrode 12. Then, the surface of the insulating film 11 is polished and made flat by the CMP method.

Figure 6E:
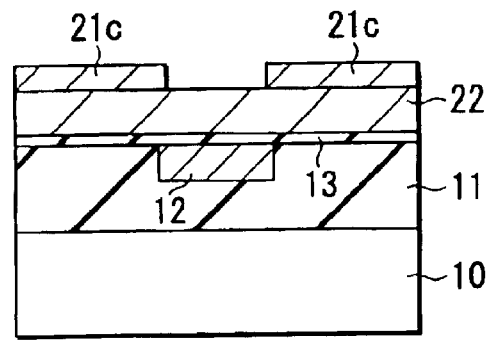
Figure 6C:
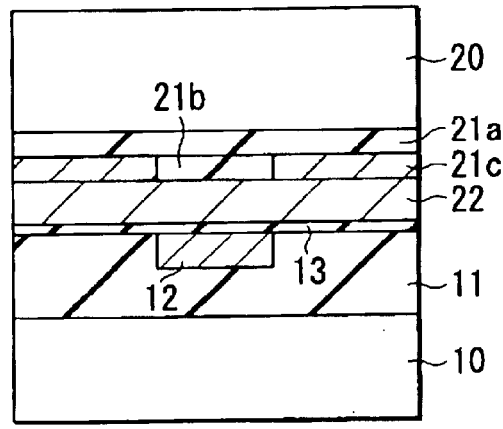

Next, another silicon substrate 10 is prepared and the surface of the silicon substrate 10 is brought into contact with the surface of the insulating film 11 as shown in FIG. 6C and they are bonded or combined by van der Waals' forces. Further, covalent bonding between the insulating film 11 and the silicon substrate 10 is caused by performing heat treatment to strengthen the bonding between them.

Figure 6F:
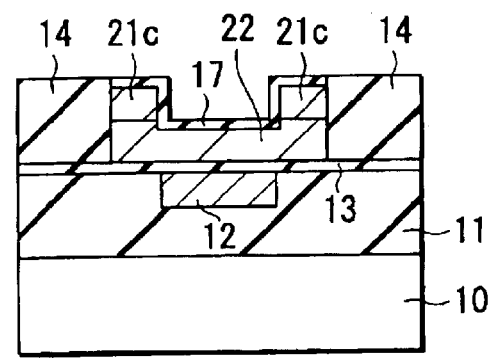
Figure 6D:
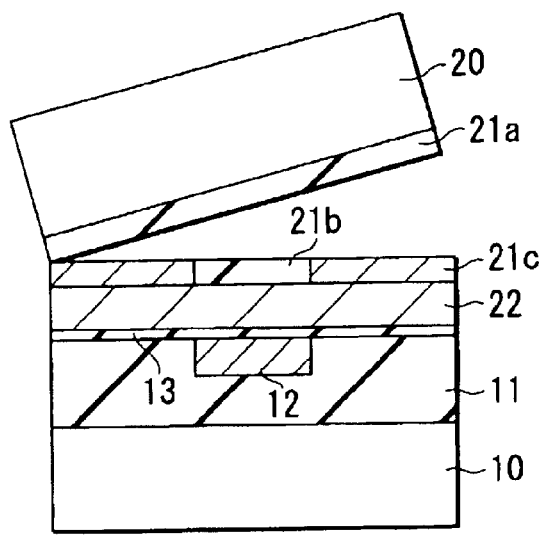

Next, as shown in FIG. 6D, the porous silicon layer 21a and silicon substrate 20 are removed. The binding strength between the porous silicon layers 21a, 21b is relatively weak because of the porous property and they can be easily separated from each other. This applies to the relation between the porous silicon layer 21a and the amorphous silicon layer 21c.

Then, as shown in FIG. 6E, the porous silicon layer 21b on the single-crystal silicon layer 22 is removed by etching. At this time, only the porous silicon layer 21b is removed while the amorphous silicon layer 21c is left behind by use of the selective etching ratio between the porous silicon layer 21b and the amorphous silicon layer 21c.

Next, as shown in FIG. 6F, a front-gate insulating film 17 is formed on the rear surface of the single-crystal silicon layer 22, that is, on the surface opposite to the surface on which the back-gate insulating film 13 is formed by a known method. Further, an element isolation region 14 is formed to penetrate through the amorphous silicon layer 21c and single-crystal silicon layer 22 by use of the STI technique, for example.

Figure 6G:
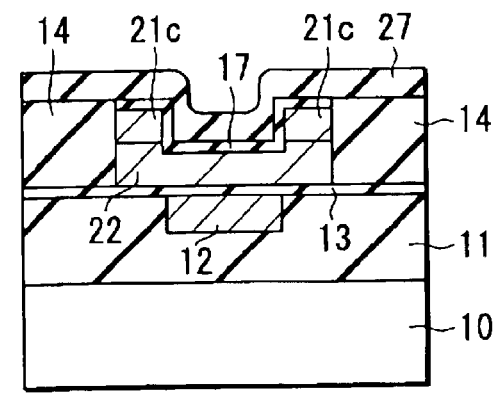

After this, as shown in FIG. 6G, an insulating film 27 is formed on the amorphous silicon layers 21c and front-gate insulating film 17 by the CVD method or the like, for example. At this time, it is necessary to prevent the insulating film 27 from being fully buried into an area between the adjacent amorphous silicon layers 21c, 21c.

Figure 6H:
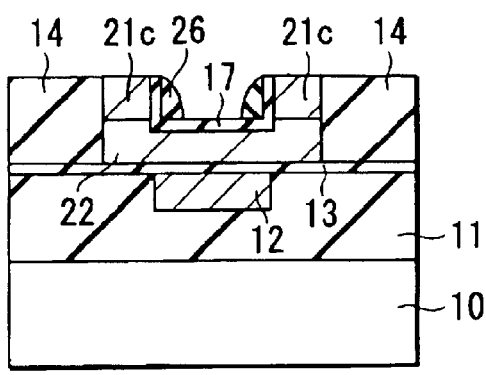

After this, a portion of the insulating film 27 which lies on part of the front-gate insulating film 17 and the amorphous silicon layer 21c is removed by use of an anisotropic etching method such as an RIE (Reactive Ion Etching) method. As a result, as shown in FIG. 6H, side wall insulating films 26, 26 which lie only on the side wall portions of the amorphous silicon layers 21c, 21c are formed. In this step, the front-gate insulating film 17 lying on the amorphous silicon layers 21c is removed.

Figure 6I:
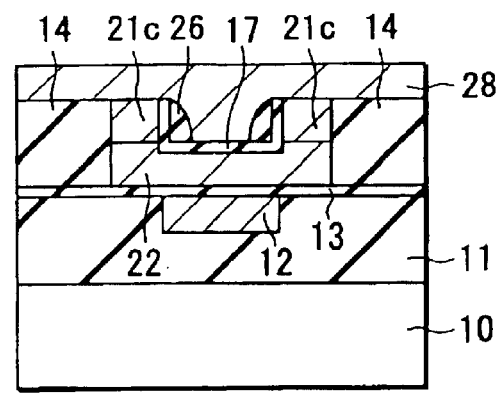

Next, as shown in FIG. 6I, a polysilicon layer 28 is formed on the amorphous silicon layers 21c and front-gate insulating film 17 by the CVD method or the like, for example. At this time, it is necessary to completely bury the polysilicon layer 28 into the area between the adjacent amorphous silicon layers 21c, 21c.

After this, the polysilicon layer 28 is polished by the CMP method using the element isolation region 14 as a stopper and left behind only in the area between the adjacent amorphous silicon layers 21c, 21c. The polysilicon layer 28 thus left behind functions as the front-gate electrode 18. Then, source and drain regions 16, 16 are formed in the single-crystal silicon layer 22 so as to complete the double-gate MOS transistor shown in FIG. 5. Some thermal steps are contained in the fabricating steps of the double-gate MOS transistor. For example, the thermal steps include heat treatment after silicon atoms are injected in FIG. 6A, heat treatment when the silicon substrate 10 is laminated in FIG. 6C, heat treatment at the time of crystal growth of respective semiconductor layers and the like. The amorphous silicon layers 21c, 21c on the source and drain regions 16, 16 are crystallized to form single-crystal silicon layers and function as source and drain electrodes 25, 25.

According to the above manufacturing method of the semiconductor device, like the first embodiment, the effect (1) can be attained. Further, (2) the degree of misalignment between the back-gate electrode 12 and the front-gate electrode 18 can be suppressed. This effect is explained below. According to the manufacturing method of the present embodiment, silicon atoms are injected into the porous silicon layer 21b by the ion-implantation method using the back-gate electrode 12 as a mask. A portion of the porous silicon layer 21b into which silicon atoms are not injected is removed and the front-gate electrode 18 is formed to fill in the removed region. That is, the front-gate electrode 18 is formed in a self-alignment fashion. Therefore, the back-gate electrode 12 and the front-gate electrode 18 are substantially completely superposed on each other in a direction perpendicular to the silicon substrate 10. As a result, the double-gate MOS transistor can be miniaturized.

Further, since the back-gate electrode 12 and the front-gate electrode 18 are substantially completely superposed on each other, the action of suppressing extension of the depletion layer caused by the junction between the drain region 16 and the silicon active layer 15 can be most effectively attained. Therefore, the short channel effect can be more effectively suppressed in comparison with the first embodiment.

Further, since the front-gate electrode 18 is formed in a self-alignment fashion, the porous silicon layer 21b into which silicon atoms are injected, that is, the amorphous silicon layer 21c, can be used as the source and drain electrode 25, 25. Therefore, a step of newly forming source and drain electrodes is not required. Therefore, the effect (2) can be attained without making the fabricating steps of the double-gate MOS transistor complicated.

Figure 7:
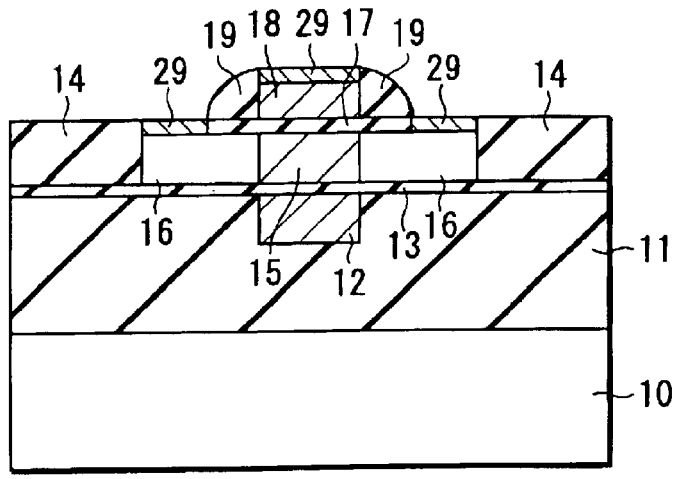
FIG. 7 is cross-sectional view of a semiconductor device according to a modification of the embodiment of the present invention.

As described above, according to the semiconductor device and the manufacturing method thereof according to the first and second embodiments of the present invention, a double-gate MOS transistor in which the film thickness of the silicon active layer can be controlled with high precision can be provided. The transistor structure is not limited to the structures shown in FIG. 2 and FIG. 5 and can be variously modified. FIG. 7 is a cross-sectional view of a double-gate MOS transistor according to a modification of the first embodiment. In the modification, metal silicide layers 29 are formed on the surfaces of the source and drain regions 16, 16 and the surface of the front-gate electrode 18. As the metal silicide layer 29, $CoSi_x$, $WSi_x$, $MoSi_x$, $TaSi_x$, $TiSi_x$ or the like can be used, for example.

Further, in the above embodiments, a case wherein polysilicon is used as a material of the back-gate electrode 12 and front-gate electrode 18 is explained, but high-melting point metal or the like may be used, for example.

Figure 8A:
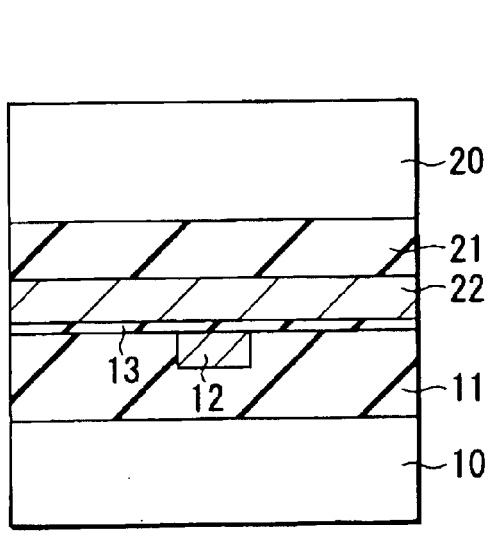
FIG. 8A and FIG. 8B are cross-sectional views sequentially showing part of the manufacturing steps of a semiconductor device according to a modification of the embodiment of the present invention.
Figure 8B:
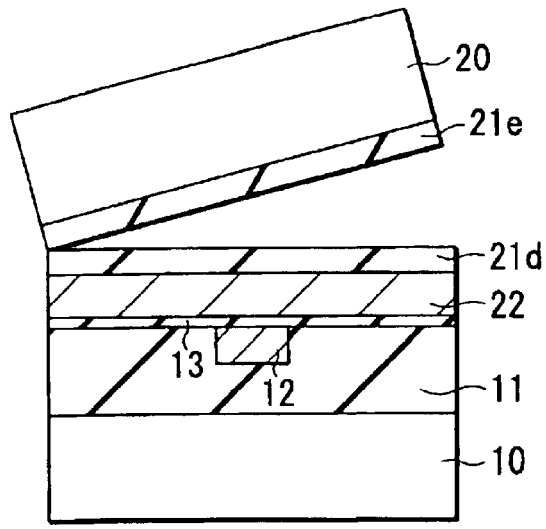

As described before, in the first embodiment, the porous silicon layer 21 as the first film may have a single-layered structure. FIG. 8A is a cross-sectional view of a double-gate MOS transistor obtained when performing the steps up to the step shown in FIG. 3E in the first embodiment while the porous silicon layer 21 is formed to have the single-layered structure. In this case, as shown in FIG. BB, the porous silicon layer 21 may be divided into two porous silicon layers 21d, 21e and then the porous silicon layer 21d may be separated from the single-crystal silicon layer 22.

Figure 9A:
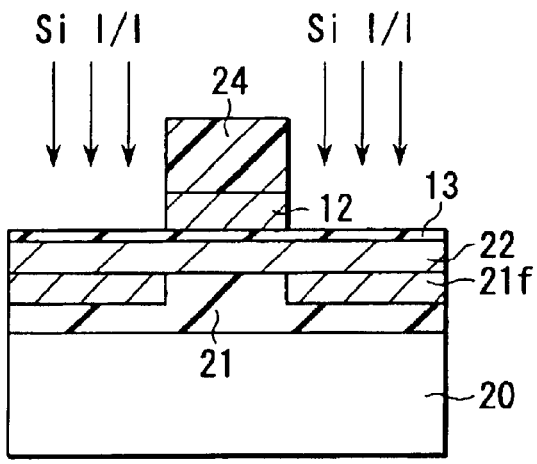
FIG. 9A to FIG. 9D are cross-sectional views sequentially showing part of the manufacturing steps of a semiconductor device according to a modification of the embodiment of the present invention.
Figure 9B:
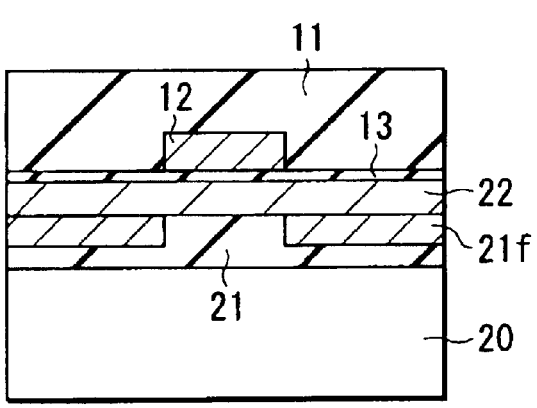
Figure 9C:
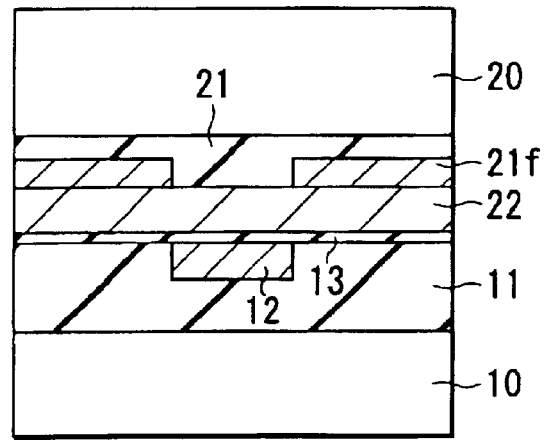
Figure 9D:
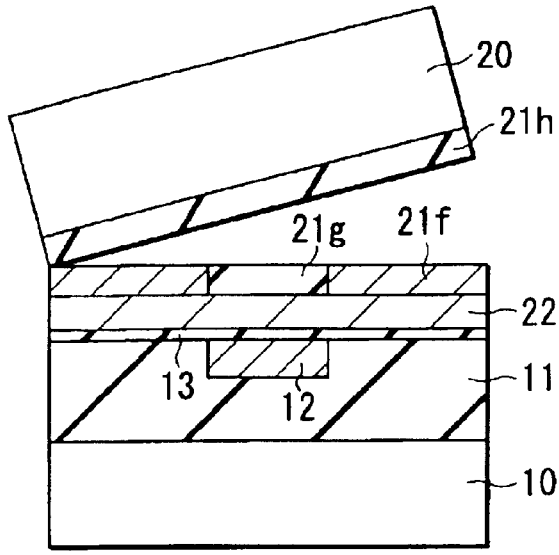

Also, in the second embodiment, the porous silicon layer 21 as the first film may have a single-layered structure. In this case, the ion-implantation step explained with reference to FIG. 6A in the second embodiment can be performed to form an amorphous silicon layer 21f of depth which extends from the surface of the porous silicon layer 21 to an intermediate portion thereof, as shown in FIG. 9A. After this, an insulating film 11 is formed as shown in FIG. 9B and then a silicon substrate 10 is laminated therewith as shown in FIG. 9C. Next, as shown in FIG. 9D, the porous silicon layer 21 may be divided into two porous silicon layers 21g, 21h and then the porous silicon layer 21g may be separated from the single-crystal silicon layer 22.

As indicated above, the first film 21 may comprises either two or more layers that can be easily separated from one another, or only one layer that can be divided into two or more layers. The first film 21 is provided to separate the silicon substrate 20 from the silicon substrate 20 from the silicon substrate 10. In view of this, the first film 21 should be called "separator". The film 21 is not limited to such a porous silicon layer as used in the embodiments described above. Rather, it may be any film that can be divided into two films in order to remove the silicon substrate 10. That is, the film 20 can be made of silicon or any other semiconductor material. In some cases, it can be made of metal or insulating material.

Further, the reason why silicon atoms are injected in the ion-implantation step explained with reference to FIG. 6A is to change the porous silicon layer 21b into an amorphous form. Therefore, atoms to be injected are not limited to silicon if the same effect can be attained and, for example, geranium can be used.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor device comprising:
   a first gate electrode formed in a surface region of an insulating film;
   a first gate insulating film formed on the first gate electrode;
   a semiconductor layer formed on the first gate insulating film;
   source and drain regions separately formed at least in a surface region of the semiconductor layer;
   source and drain electrodes respectively formed on the source and drain regions while positions of side wall surfaces thereof which face each other are substantially aligned with positions of both side wall surfaces of the first gate electrode in a direction perpendicular to the surface of the insulating film;
   a second gate insulating film formed on a portion of the semiconductor layer which lies between the source and drain electrodes; and
   a second gate electrode formed on the second gate insulating film and electrically isolated from the source and drain electrodes, the second gate electrode being formed in self-alignment with the first gate electrode, wherein the source and drain electrodes have a same thickness as the second gate electrode.

2. The semiconductor device according to claim 1, wherein upper surfaces of the source and drain electrodes lie substantially on the same plane as an upper surface of the second gate electrode.

3. The semiconductor device according to claim 1, wherein each of the source and drain electrodes is a porous silicon layer having silicon atoms injected therein.

4. The semiconductor device according to claim 1, wherein a bottom surface of the source and drain region reaches a bottom surface of the semiconductor layer.

5. A semiconductor device comprising:
   a first gate electrode formed in a surface region of an insulating film;
   a first gate insulating film formed on the first gate electrode;
   a semiconductor layer formed on the first gate insulating film;
   source and drain regions separately formed at least in a surface region of the semiconductor layer;
   source and drain electrodes respectively formed on the source and drain regions while positions of side wall surfaces thereof which face each other are substantially aligned with positions of both side wall surfaces of the first gate electrode in a direction perpendicular to the surface of the insulating film;
   a second gate insulating film formed on a portion of the semiconductor layer which lies between the source and drain electrodes; and
   a second gate electrode formed on the second gate insulating film and electrically isolated from the source and drain electrodes,
   wherein each of the source and drain electrodes is a porous silicon layer having silicon atoms injected therein.

6. The semiconductor device according to claim 5, wherein upper surfaces of the source and drain electrodes lie substantially on the same plane as an upper surface of the second gate electrode.

7. The semiconductor device according to claim 5, wherein a bottom surface of the source and drain region reaches a bottom surface of the semiconductor layer.

* * * * *